United States Patent [19]

Cases et al.

[11] 4,120,035

[45] Oct. 10, 1978

[54] ELECTRICALLY REPROGRAMMABLE TRANSVERSAL FILTER USING CHARGE COUPLED DEVICES

[75] Inventors: Moises Cases, Fishkill; Fung Yuel Chang; Barry Jay Rubin, both of Wappingers Falls, all of N.Y.

[73] Assignee: International Business Machines Corporation, Armonk, N.Y.

[21] Appl. No.: 825,123

[22] Filed: Aug. 16, 1977

[51] Int. Cl.² .................... G06G 7/16; H03K 5/159
[52] U.S. Cl. ....................... 364/602; 307/221 D; 328/167; 333/70 T; 364/825; 364/841; 364/862
[58] Field of Search ............ 364/602, 607, 825, 841, 364/862, 606; 307/221 D; 328/167; 333/70 T, 18, 28 R; 357/24

[56] References Cited

U.S. PATENT DOCUMENTS

| | | | |
|---|---|---|---|
| 3,935,439 | 1/1976 | Buss et al. ................... | 364/825 X |
| 3,952,188 | 4/1976 | Sloate et al. .................. | 364/825 |
| 3,979,582 | 9/1976 | Mims .......................... | 364/825 X |
| 4,032,767 | 6/1977 | Lagnado ....................... | 364/841 X |
| 4,039,978 | 8/1977 | Heller ......................... | 333/70 T |
| 4,052,606 | 10/1977 | Heller et al. .................. | 364/825 |

OTHER PUBLICATIONS

Ibrahim et al., "CCD's for Transversal Filter Applications", Technical Digest, 1974, International Electron Device Meeting, pp. 240-243.
Brodersen et al., "A 500-Point Fourier Transform Using Charge—Coupled Devices", Conference Record, 1975, IEEE, ISSCC, pp. 144-145.
Mattern et al., "A Reprogrammable Filter Bank Using CCD Discrete Analog Signal Processing", Conference Record, 1975, IEEE, ISSCC, pp. 148-149.
Hague et al., "An Electrically Programmable Transversal filter", Technical Digest, 1976, International Electron Device Meeting, pp. 27-30.
Sequin et al., "Linearity of Electrical Charge Injection into Charge-Coupled Devices", Tech. Digest, 1974, Int'l Electron Device MTG., pp. 229-232.
Wen et al., "Analysis and Design of a Single-Stage Floating Gate Amplifier", Conference Record, 1973, IEEE, ISSCC, pp. 154-155.

*Primary Examiner*—Joseph F. Ruggiero
*Attorney, Agent, or Firm*—George O. Saile

[57] ABSTRACT

A charge coupled device analog multiplier is used to weigh the sampled and delayed signals for a transversal filter. The digital filter coefficients for the analog multiplier can be electrically programmed and therefore dynamic time-varying systems, such as matched filters, can be designed with reduced circuit complexity. The digital filter includes means for sampling without destroying an analog signal at various points and providing voltages proportional to each sampled signal. The voltages are separately applied to a charge coupled device analog multiplier which accepts the voltages and provides means for multiplying the digital filter coefficient by the analog voltage. The multiplied sample signal is then dumped into a means for summing all of the weighted sample signals to produce an analog signal modified by the digital filter coefficients.

6 Claims, 11 Drawing Figures

CHARGE INPUT

CHARGE SENSED AND CHARGE CLEARANCE

CHARGE ADDITION

CHARGE DIVISION

ELECTRICALLY REPROGRAMMABLE TRANSVERSAL FILTER USING CHARGE COUPLED DEVICES

BACKGROUND OF THE INVENTION

The invention relates to a transversal filter device with an improved analog multiplier that is designed to be formed in a charge coupled device integrated circuit.

DESCRIPTION OF THE PRIOR ART

The operation of a transversal filter requires the summing of a sequence of an input signal which is sampled, delayed and multiplied by various weighting factors. Several schemes of implementing a transversal filter using the charge-transfer devices as the delay and storage elements have been reported in the literature, for example, in the article "CCD's For Transversal Filter Application" by A. Ibrahim et al, Technical Digest, 1974, International Electron Device Meeting, pages 240–243. This publication describes two techniques of weighting the delayed sample signals. In the first method, samples of delayed input signal in the form of charge packets stored in a CCD are multiplied through the utilization of split-electrodes whose gap location defines the multiplying coefficients. Specific application of this split-electrode technique has also been described in the article entitled "A 500-point Fourier Transform Using Charge-Coupled Devices" by R. W. Brodersen et al, Conference Record, 1975 IEEE ISSCC, page 144–145. In the second method, the stored charges are sensed through the floating diffusions and the resultant sensed voltages are then weighted and summed by using the operational amplifiers. Both of the two methods mentioned above allow only fixed filter multiplying coefficients. For every new set of filter coefficients, either a new masking design defining the gap locations or a redesign of the operational amplifiers with changes in ratios of resistor values, which define the filter coefficients, is required. Both methods also suffer the drawback of inaccuracy in matching a given set of filter coefficients since neither exact gap locations nor perfect resistor tracking can ever be achieved.

An example of transversal filter design using the CCD's as delay lines that allows adjustable filter coefficients is described in the article "A Reprogrammable Filter Bank Using CCD Discrete Analog Signal Processing" by J. Mattern and D. Lampe, Conference Record, 1975 IEEE ISSCC, pp, 148–149. In the cited article, the digitized filter coefficients are stored in Programmable Read Only Memories (PROM's). These coefficients are retrieved and converted into analog signals which enable the delayed sample signals to be multiplied through the operational amplifiers. Reprogramming of the filter is accomplished by replacement of the read-only memory. This approach has the disadvantages of requiring expensive PROM's for storing the filter coefficients and complicated analog circuitry for performing the weighting and summing of sample signals. Furthermore, it does not take full advantage of the analog properties of the CCD's and the whole system cannot be integrated into a single semiconductor chip. In our invention, the CCD's are used not only as the delay lines, but the multiplication is also carried out within the charge-coupled devices, therefore the whole system can be fabricated on a single chip.

Another example of a reprogrammable transversal filter is described in the publication "An Electrically Programmable Filter", by J. A. Hogue and M. A. Copeland, Technical Digest, 1076 International Electron Device Meeting, pp. 27–30. In the cited article, shift registers are used for both storage and circulation of binary-coded filter coefficients. The binary signals corresponding to these filter coefficients determine the appropriate combination of binary-weighted MOS capacitors for signal multiplication. The accuracy of this technique is limited by the tolerance and tracking of the area ratioed MOS capacitors which define the filter coefficients in binary form. A method of signal multiplication which require neither such area ratioed capacitors nor the gap positioned, split electrodes has been described in a patent application entitled "A Logic Controlled Charge Transfer Device Transversal Filter Employing Simple Weighting", Ser. No. 676,037 filed Apr. 12, 1976, now U.S. Pat. No. 4,039,978. In that patent application, a charge splitting MOS circuitry is used for generating a sequence of charge packets: $Q/2$, $Q/4$, $Q/8$, . . . , $Q/2^n$, for each sampled, input signal. These charge packets are then stored in parallel CCD shift registers. Using logic control and FET switches, the binary weighted, charge packets generated from the delayed, sample signals are then summed with tap weights of $+1$, $-1$ and 0 corresponding to the binary digits of the filter coefficients. This technique has the disadvantage of requiring external memory and logic circuits for storing and controlling the binary-coded filter coefficients. In the present invention, a similar concept of charge splitting is employed for carrying out the weighting of the delayed sample signals. However, using the add and split procedure, the signal multiplication is carried out within the charge coupled device. Therefore, there is no requirement for parallel CCD shift registers for storing the sequence of charge packets, which are weighted with geometrically progressive factors as it is described herein.

Another approach of implementing a transversal filter using charge transfer device is described in the patent application entitled "Charge Transfer Device Transversal Filters" filed by IBM with Ser. No. 699,908, filed June 25, 1976, now U.S. Pat. No. 4,052,606. In that patent application, a pair of charge transfer device shift registers are used as delay lines for both the input signal and the filter transfer function signal. The convolution integral of the signal and transfer function is then achieved through sum and square procedure using the nonlinear characteristics of the field effect transistor (FET). The accuracy of this technique relies on the ideal, square-law characteristics of the FET's driven into saturation region, which will be difficult to achieve without error.

Implementing a transversal filter using the CCD's as delay lines requires the conversion of electrical signal into electron charge packets. A method of generating charge packets with the number of electrons directly proportional to the magnitude of the input sample signals has been taught in the publication "Linearity of Electrical Charge Injection into Charge-Coupled Devices" by C. H. Sequin and A. M. Mohsen, Technical Digest, 1974 International Electron Device Meeting, pp. 229–232.

A nondestructive, reverse process of inducing an electrical signal from the stored charge packet has been described in the article "Analysis and Design of a Single-Stage Floating Gate Amplifier" by D. D. Wen and P. J. Salsburg, Conference Record, 1973 IEEE ISSCC, pp. 154–155. This reverse process allows the delayed sample signals in the form of charge packets to be properly weighted.

SUMMARY OF THE PRESENT INVENTION

A transversal filter charge-coupled structure wherein charge-coupled devices perform every functional operation, including the storage of electrical reprogrammable filter coefficients and the sampling, the delaying as well as the weighting of input signals. Thus, the whole system can be integrated into a single semiconductor chip. The operational principle of the invention is described in the following paragraphs.

Each digital filter coefficient is sequentially stored and circulated in a CCD serial shift register. Each filter coefficient in the form of binary, electrical pulses with the least significant bit appearing first controls an analog multiplier for carrying out the proper signal multiplication. These filter coefficients can be supplied externally or modified by the filter output. Therefore, the filter can also function as a recursive or matched filter.

Periodically, the input electrical signal is converted into a charge packet which is then stored and circulated in a charge-coupled device functioning as a delay line. Each charge packet corresponding to a delayed signal sample is then sensed and converted into an electrical signal which determines the amount of charges to be repeatedly regenerated in an analog multiplier. The signal multiplication is then achieved by iteratively adding and splitting of these regenerated charge packets in response to the binary pulses corresponding to the binary filter coefficients. Finally, these resultant charge packets are routed to two summing capacitors of proper coefficient signs.

DESCRIPTION OF THE PREFERRED EMBODIMENT

A transversal filter produces an output $g(t)$ from a given input signal $f(t)$ in accordance to the following expression:

$$g(t) = \sum_{K=1}^{N} A_K f(t - \tau_K)$$

Thus, the proper operation of a transversal filter requires non-destructive sampling, weighting and summing of a delayed input signal. The system for achieving such is shown in FIG. 1.

Figure 1:
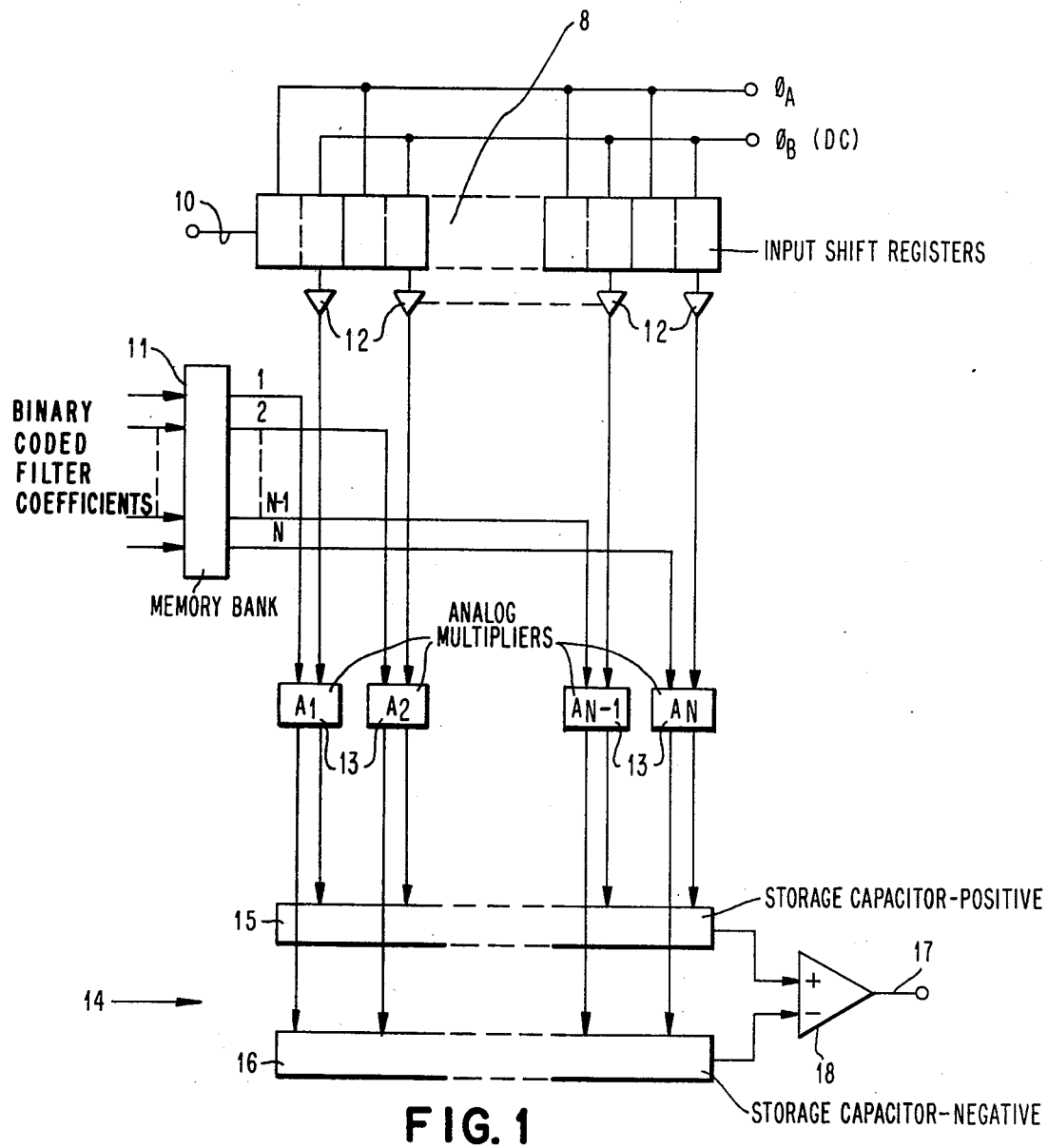
FIG. 1 illustrates the block diagram of the N-stage transversal filter structure of the present invention.

Referring to FIG. 1, the filter system is of N stages. The filter is built exclusively in charge-coupled device (CCD) integrated circuit structures and preferably on one silicon integrated circuit. Means 8 are provided for storing the charge packets corresponding to the delayed sample signals. These charge packets are generated from the analog input signal applied at line 10. $\phi_A$ and $\phi_B$ are the clock voltages for operation of means 8. Means 11, which is typically, a CCD shift register memory, is provided for storage of digitized filter coefficients. The charge packets in means 8 are sampled and converted into voltage form by floating gate amplifiers 12. The various sampled voltages are now applied to the charge-coupled device analog multipliers 13. The individual multipliers are designated $A_1$, $A_2$, $A_3$, $A_{N-1}$ and $A_N$. The analog multiplier includes means for applying one of the voltages to a sample signal gate which creates charge linearly proportional to the product of the digital filter coefficients and the analog sample signal amplitude. Therefore, the analog multiplier provides means for multiplying the analog voltage by the digital filter coefficients. The multiplied sample signal is then dumped into means 14 for summing all of the sample signals to produce at line 17 an analog signal modified by the digital coefficients. The summing means 14 preferably includes a positive coefficient storage capacitor 15 and a negative coefficient storage capacitor 16. The outputs of the two storage capacitors are applied to operational amplifier 18 wherein the net output signal corresponding to the algebraic sum of the weighted and delayed samples of the input is obtained at line 17.

Figure 2A:
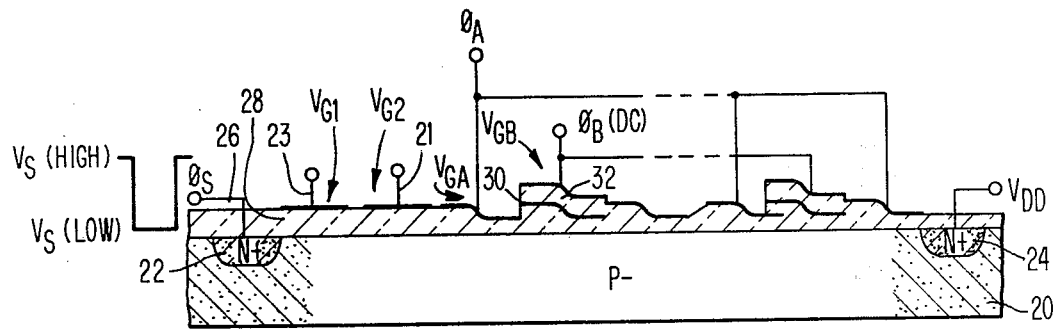
FIG. 2A shows the schematic diagram of a charge-coupled device serial shift register which performs the analog input signal charge conversion, sampling and delaying.
Figure 2B:
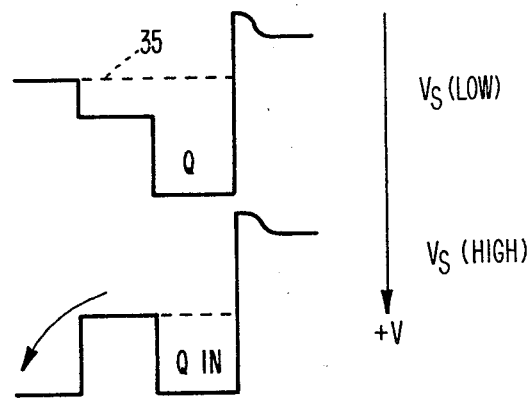
FIG. 2B illustrates the operation of electrical signal injection into a charge-coupled device structure.
Figure 2C:
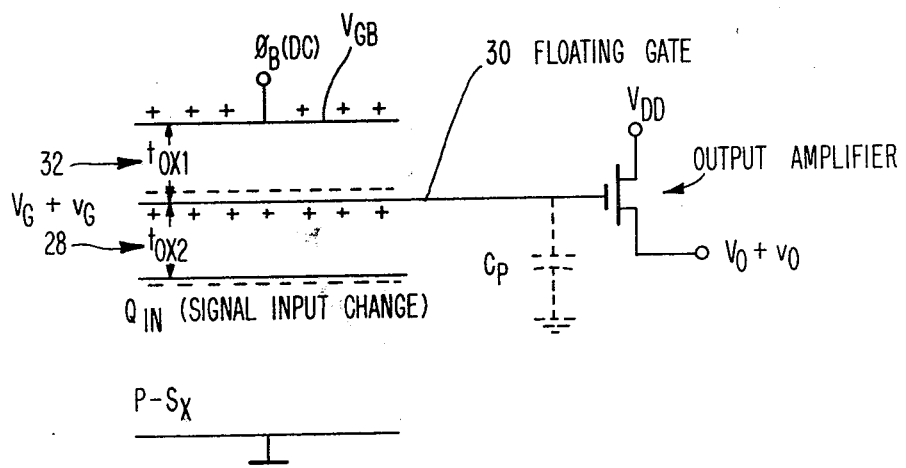
FIG. 2C shows the schematic diagram of a signal charge under the floating gate electrostatically producing a change in the floating gate potential which is proportional to the total number of electrons under a gate.

FIGS. 2A and 2B are useful in understanding the mechanism of converting an analog sample signal into a charge packet which is linearly proportional to the amplitude of the signal. FIG. 2A shows the structure of a charge-coupled device formed in and on a P— substrate 20. An input N+ diffusion 22 and output N+ diffusion 24 are made into the substrate 20 at opposite ends of the CCD structure. A voltage pulse is applied via line 26 to the input diffusion region 22 for purpose of charge generation. An oxide region 28 covers the surface of the substrate 20. Above the silicon dioxide layer are the input signal gate $V_{G2}$ and the reference voltage gate $V_{G1}$. Also on top of the silicon dioxide layer are gates $V_{GA}$ and $V_{GB}$ which are connected to clock voltages $\phi_A$ and $\phi_B$ for moving the charge packets along the CCD shift register. Note that gate $V_{GB}$ is insulated from floating gate 30 by oxide layer 32. The floating gate is a part of the floating gate amplifier (FIG. 2C) to be discussed in more detail below.

The operation of this typical CCD can be seen with reference to FIGS. 2A and 2B. A voltage waveform representing the analog input signal is applied to gate $V_{G2}$ via line 21. A constant reference voltage, preferably the most negative input signal voltage that can be expected, is applied to gate $V_{G1}$ via line 23. During the sampling of the input signal, line 26 is initially pulsed low to allow charge injection while $V_{GA}$ is held at low voltage to prevent charge from flowing into the substrate under $V_{GA}$. As shown in FIG. 2B, the substrate under gates $V_{G1}$ and $V_{G2}$ is filled in with the injected charge Q up to the dashed line 35. Subsequently, line 26 returns to high voltage therefore the excess charge under gate $V_{G1}$ is removed as shown by arrow. Thus, the resultant charge $Q_{IN}$ under gate $V_{G2}$ is solely dependent on the voltage difference between gates $V_{G1}$ and $V_{G2}$. Suitable clocking voltage waveforms applied to gates $V_{GA}$ and $V_{GB}$ now allow the charge packet to be transferred along the CCD shift register. The charge packet being stored in the CCD shift register represent the delayed samples of the input analog signal. To allow the delayed, sampled signals to be properly weighted, these charge packets need to be non-destructively converted into electrical signal. This conversion can be achieved by using the floating gate amplifiers.

With reference to FIG. 2A, the clock voltage $\phi_B$ applied to gate $V_{GB}$ is a DC voltage which allows the charge to be transferred into the substrate under $V_{GB}$ whenever $\phi_A$ is pulsed low and the charge is subsequently transferred out after $\phi_A$ returns to high voltage. Thus, the CCD shift register is operated with two clocks, one of which is DC. The choice of $\phi_B$ as a constant voltage also allows the floating gate amplifier of FIG. 2C to be operated properly since any charge packet flowing into the substrate under gate $V_{GB}$ will cause the floating gate potential to be lowered from the quiescent potential by an amount linerally proportional to the total number of electrons stored in the charge packet. Such variation of the floating gate potential in response to the stored charge will then be buffered by an output amplifier, preferably an FET source follower. Note that if there is no charge flowing into the substrate under $V_{GB}$, the floating gate will remain at the quiescent potential which is determined by the $\phi_B$ potential and the thicknesses of oxide layers 28 and 32 shown in FIG. 2C.

Figure 3:
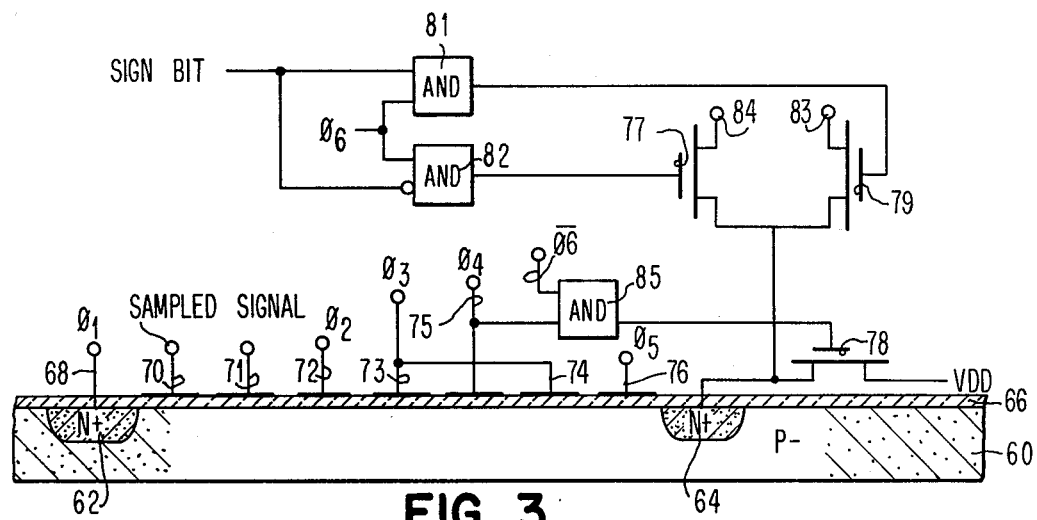
FIG. 3, 4A, 4B, and 4D illustrate the operation and structure of the analog multiplier.
Figure 4A:
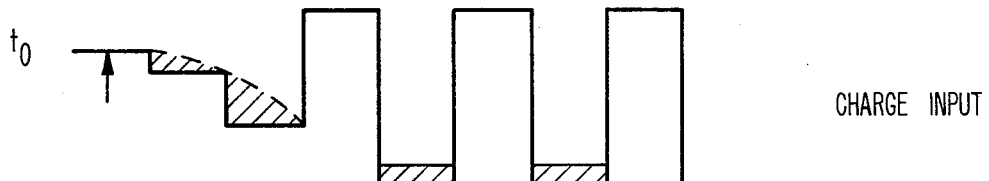
Figure 4B:
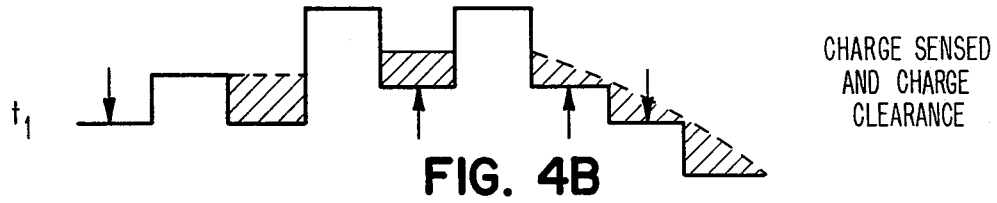
Figure 4C:
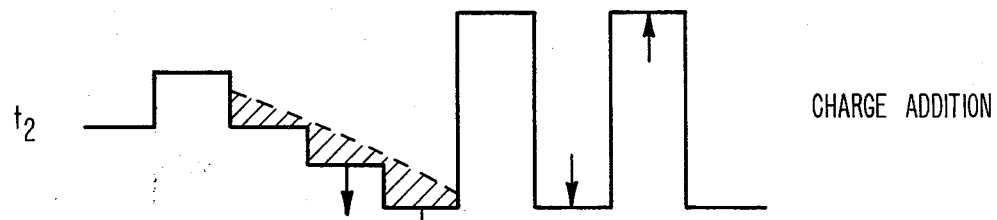
Figure 4D:
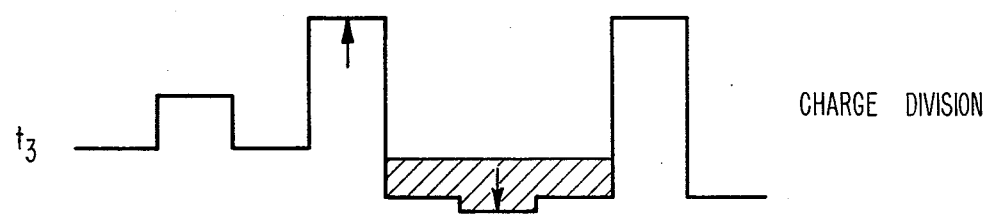
Figure 5:
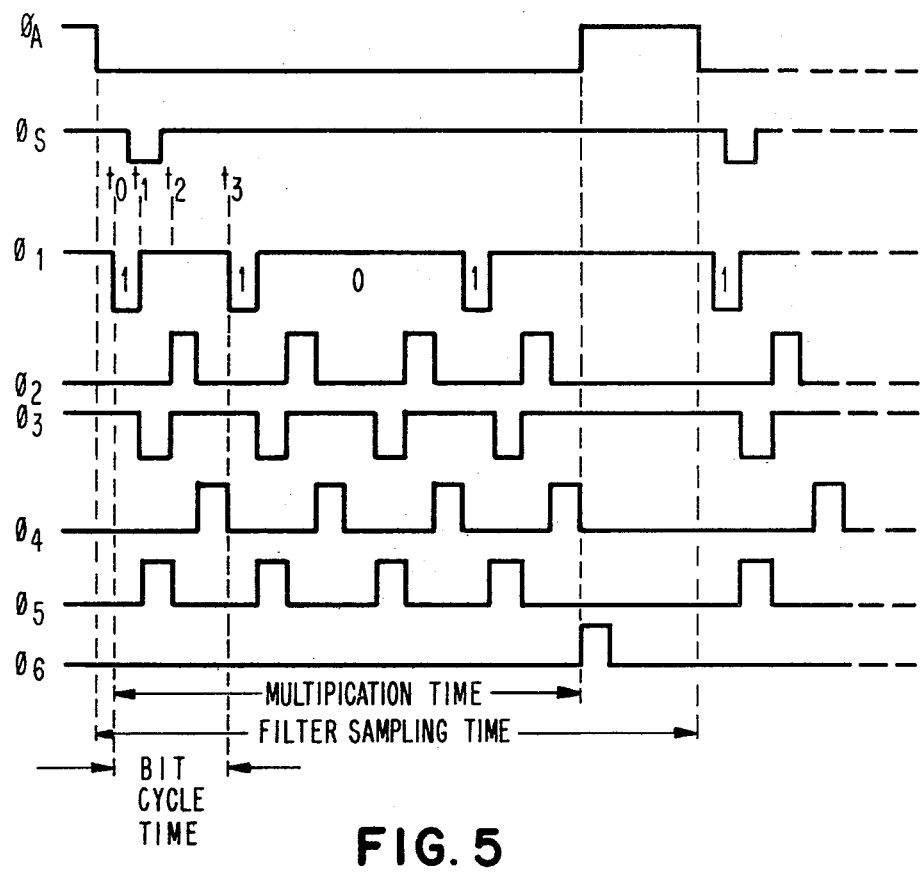
FIG. 5 shows the timing diagram of the phase voltages applied to the transversal filter.

Referring now more particularly to FIGS. 3, 4 and 5, the analog multiplier is considered in detail. FIG. 3 shows an analog multiplier for one filter coefficient. The structure is a P− substrate 60 with N+ diffusion 62 and 64 therein. A silicon dioxide layer 66 covers the surface of the substrate. The binary coded filter coefficient in the form of the pulse train is inputted to the diffusion 62 via line 68. A series of gates are positioned between the diffusions 62 and 64 upon the oxide layer 66. These gates are the sampled signal gate 70, reference voltage gate 71, the input blocking gate 72, the charge splitting storage gates 73 and 74, the charge splitting control gate 75 and the output blocking gate 76. The output from the diffused region 64 is connected to a positive coefficient control gate 79 and a negative coefficient control gate 77. The outputs of these gates go to the means 14 of FIG. 1 for summing all sample signals. Clocking pulse $\phi_6$ and sign bit of logical "1" corresponding to a positive coefficient will turn on gate 79 through AND gate 81, thus allowing the charge to be inputted to the positive coefficient capacitor through line 83. Similarly, pulse $\phi_6$ and sign bit of logical "0" will turn gate 77 through gate 82 allowing the charge to be inputted to the negative coefficient capacitor through line 84.

A reset gate 78 is also connected to the output diffused region 64 on one end and to a voltage $V_{DD}$. The inverted $\phi_6$ is also used to control the reset gate 78 through AND gate 85. The output voltage from the floating gate amplifier is applied to gate 70. A reference voltage is applied to gate 71. This reference voltage being generated from a separate but identical floating gate amplifier having no charge stored beneath its gate. Hence, when the sampled signal applied to gate 70 is associated with a zero charge in the delay line, there is no potential difference between gates 70 and 71. When a non-zero charge charge is sampled, the potential on gate 70 is lower than that on gate 71.

The analog multiplicator is accomplished by a repeated charge addition and splitting technique, where the binary-coded filter coefficients are the controlling pulses. Without loss of generality, the weighting coefficients can be normalized to magnitudes less than unity. Therefore, within a given truncation error, the coefficients can be represented by binary sequences of finite bit length. For example, a 4-bit coefficient such as:

$$1011 = 1(\tfrac{1}{2}) + 0(\tfrac{1}{2})^2 + 1(\tfrac{1}{2})^3 + 1(\tfrac{1}{2})^4$$

means that the analog signal is to be multiplied by a factor of 11/16. Referring to FIG. 3, the binary sequence in the form of electrical pulses with the least significant bit appearing first are applying to the N+ diffusion 62. The analog sampled signal from the output of the floating-gate amplifier is applied to the sample signal gate 70, which determines the amount of charge proportional to the signal amplitude to be generated. The presence of a pulse (corresponding to bit "1" of a binary-filter coefficient) at the N+ diffusion 62 will allow charge to be generated. Thus, for the binary coefficient 1011, the least significant bit (which is one) generates the charge which is subsequently divided into two halves by the charge splitting control gate 75. One of the half charge is retained in the potential well under charge storage gate 73, while the other half charge residing under gate 74 is dumped into the N+ diffusion 64. The next significant bit generates a full amount of charge which is added to the half charge and then divided into two, producting $$\tfrac{3}{4} \text{ unit } (= \tfrac{1}{2} + (\tfrac{1}{2})^2)$$

of charge stored under gate 73. The third bit, which is a zero, does not generate any charge. Therefore, the amount of charge retained after processing the third bit becomes $$\tfrac{3}{8} \text{ unit } (= \tfrac{1}{2}(0) + \tfrac{1}{2} \cdot \tfrac{3}{4}).$$

Finally, the most significant bit (which is one) generates one unit of charge and after completing the add and divide procedure, $$\tfrac{11}{16} \text{ unit } (= \tfrac{1}{2}(1) + \tfrac{1}{2}(\tfrac{3}{8}))$$

of charge proportional to the analog sample signal is retained in the potential well under gate 73. This weighted-signal charge is then sensed through the N+ diffusion 64 and dumped into the proper storage capacitor depending on the sign bit of the filter coefficient. The sign bit, also in the form of voltage used to select the proper storage capacitor through gates 79 and 77.

The operation of the analog multiplier of FIG. 3 can be more fully understood with reference to the potential well diagrams of FIG. 4A through 4D and the phase voltage, time diagrams of FIG. 5.

At $t_o$ (FIG. 4A), the voltage on diffusion 62 is pulsed low to allow charge to fill the substrate under gates 70 and 71 if the corresponding bit of the digital coefficient is a 1. If the said bit is a zero, then no pulse is applied to 62. The voltage on gate 72 is set low to prevent charge from flowing into the substrate below gate 72. Meanwhile, the voltage on gate 75 in lowered to split the existing charge located in the substrate region under gates 73, 75 and 74.

At $t_1$ (FIG. 4B), diffusion 62 is pulsed high to remove any excess charge from the region under gates 70 and 71 if the corresponding bit of the digital coefficient is a 1. If it is a zero, then the voltage on diffusion 62 remains high. Thus, a charge is generated under gate 71 which is linearly proportional if the bit is a 1, to the difference in voltage between gates 70 and 71. If the said bit is a zero, no charge is generated under gate 71. Gates 73, 74 and 76 are pulsed low to remove the charge located under gate 74. During $t_2$ (FIG. 4C), the inputted charge is added to the pre-existing charge under gate 73 by pulsing gate 72 high. Gate 76 is then pulsed low.

During $t_3$ (FIG. 4D), gate 75 is pulsed high to allow the charge to spread uniformly into the regions under gates 73, 74 and 75 in preparation for charge splitting. Gate 72 is pulsed low.

The clocking sequence $t_o$, $t_1$, $t_2$ and $t_3$ is repeated for each bit in the digital coefficient. The resulting charge under gate 73 in response to the last bit in the coefficient is the sampled signal multiplied by the digital coefficient.

FIG. 5 shows the timing diagram of the phase voltages applied to the various gates of the analog multiplier when the digital coefficient is 1011. The multiplication of the sampled signal by the digital coefficient takes four bit cycle times. During $t_3$ of the last bit cycle time (most significant bit), the sign bit and $\phi_6$ are used to dump the resulting charge in the appropriate summing capacitor.

Figure 6:
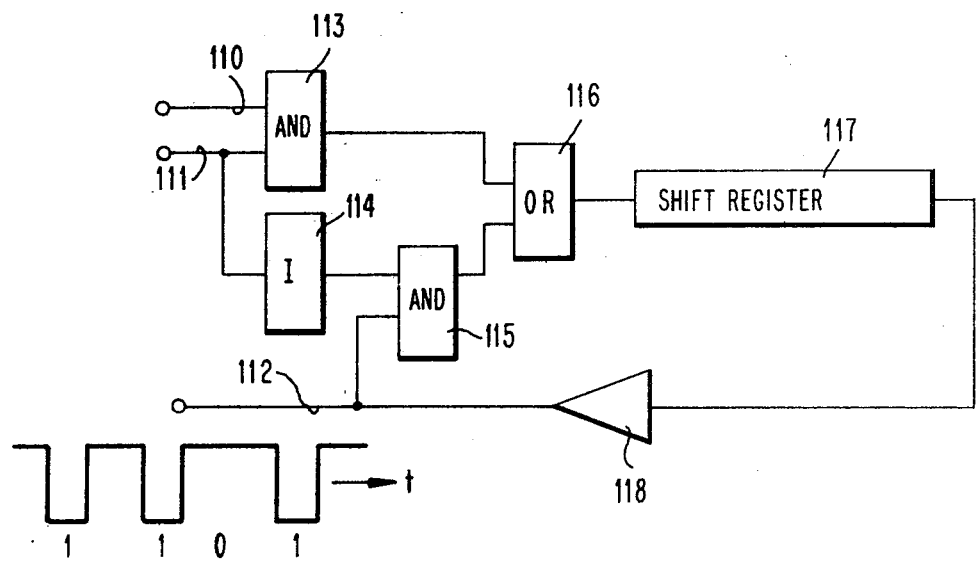
FIG. 6 shows a charge-coupled device serial shift register for storing one binary-coded filter coefficient.

Means 11 of FIG. 1 is used for storage of filter coefficients coded in binary form. It consists of serial CCD shift registers arranged as a parallel array with each register storing a filter coefficient as shown in FIG. 6. For dynamic recursive filter application, these filter coefficients can be altered through program command line 111 and coefficient input at line 110. For non-recursive transversal filter applications, these filter coefficients remain unchanged while circulating through the register. Thus, when a program command is issued, a logical "1" is applied to line 111, allowing the new filter coefficient to be transmitted through AND gate 113 and OR gate 116 and inputed to the CCD shift register 117. Note that is no program command is issued, line 111 will be at logical "0" state which enables AND gate 115 through INVERTER 114, thus allowing the old filter coefficients to be recirculated through the recirculation loop 118 and be inputted to the shift register through gates 115 and 116. The binary filter coefficient in the form of a pulse train is transmitted to the analog multiplier through line 112.

While the invention has been particularly shown and described with reference to the embodiments thereof, it will be understood by those skilled in the art that the foregoing and other changes in form and detail may be made without departing from the spirit and scope of the invention.

What is claimed is:

1. A CCD digital filter comprising:
    means for sampling without destroying an analog signal at various points and providing voltages proportional to each sampled signal;
    means for separately applying said voltages to a CCD analog multiplier;
    said analog multiplier including means for applying one of said voltages to a sample signal gate which creates charge linearly proportional to the amplitude of said analog signal; means for applying an digital filter coefficient for creating or not-creating said charge depending upon whether the bit of said filter coefficient is 1 or 0; a charge splitting storage gate; means for transferring charge from the substrate beneath the said sampled signal gate to the substrate beneath the said charge splitting gate; a charge splitting control gate for splitting the said charge; means for dumping one portion of the said split charge; and means for passing the said filter coefficient through the said analog multiplier successively according to the number of bits in said filter coefficient which results in the multiplication of said analog signal by said filter coefficient;
    means for simultaneously dumping the separate multiplied sample signal into a means for summing all sample signals to produce an analog signal modified by digital filter coefficients.

2. The CCD digital filter of claim 1 wherein said means for sampling includes a floating gate CCD amplifier wherein the signal charges are not mixed with other carriers.

3. The CCD digital filter of claim 1 wherein the said voltages proportional to each sampled signal are applied to its own CCD analog multiplier.

4. The CCD digital filter of claim 1 wherein a memory has said digital filter coefficients stored therein and is connected to said means for applying a digital filter coefficient.

5. The CCD digital filter of claim 1 wherein said means for summing are two storage capacitors, one of which being a positive coefficient and the other a negative coefficient, and an operational adder connected to the outputs of said two storage capacitors.

6. The CCD digital filter of claim 1 wherein all functional elements of said filter are formed of charged coupled devices on a single piece of monocrystalline silicon.

* * * * *